(12) United States Patent  
Matsumoto

(10) Patent No.: US 7,042,243 B2
(45) Date of Patent: May 9, 2006

(54) DEVICE TEST APPARATUS AND TEST METHOD INCLUDING CONTROL UNIT(S) BETWEEN CONTROLLER AND TEST UNITS

(75) Inventor: Kyozo Matsumoto, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 50 days.

(21) Appl. No.: 10/853,237

(22) Filed: May 26, 2004

(65) Prior Publication Data

US 2004/0239359 A1    Dec. 2, 2004

(30) Foreign Application Priority Data

May 30, 2003  (JP) .............................. 2003-155827

(51) Int. Cl.
*G01R 31/26* (2006.01)
(52) U.S. Cl. ..................... 324/763; 324/765
(58) Field of Classification Search .............. 324/73.1, 324/754, 759, 763–765, 158.1; 714/724, 714/718, 721, 726, 733–738
See application file for complete search history.

(56) References Cited

U.S. PATENT DOCUMENTS 6,351,834 B1 *  2/2002  Maekawa et al. ........... 714/718
6,779,140 B1 *  8/2004  Krech et al. ................ 714/718

FOREIGN PATENT DOCUMENTS

JP           64-47148          3/1989

* cited by examiner

*Primary Examiner*—Minh N. Tang
(74) *Attorney, Agent, or Firm*—Nixon & Vanderhye P.C.

(57) ABSTRACT

One test board for executing a test is provided for each of a plurality of DUTs (Devices-Under-Test) such as semiconductor integrated circuits, a multi test board controller for managing these test boards is provided, and a plurality of test boards managed by each multi test board controller are operated in parallel to simultaneously perform independent tests on the respective DUTs.

7 Claims, 6 Drawing Sheets

DEVICE TEST APPARATUS AND TEST METHOD INCLUDING CONTROL UNIT(S) BETWEEN CONTROLLER AND TEST UNITS

CROSS-REFERENCE TO RELATED APPLICATION

This non-provisional application claims priority under 35 U.S.C. §119(a) on Patent Application No. 2003-155827 filed in Japan on May 30, 2003, the entire contents of which are hereby incorporated by reference.

BACKGROUND OF THE INVENTION

The present invention relates to an apparatus and method for testing devices-under-test, for example, semiconductor integrated circuits such as an LSI wafer, and more particularly relates to a test apparatus and a test method capable of simultaneously performing independent tests on a large number of devices-under-test.

Conventionally, independent tests are simultaneously carried out on a plurality of devices-under-test (for example, Japanese Utility Model Application Laid-Open No. 64-47148/1989). FIG. 1 is a block diagram of a conventional test apparatus disclosed in Japanese Utility Model Application Laid-Open No. 64-47148/1989. This test apparatus comprises: a plurality of test units 31–33 controlled by microprocessors storing test programs which are operated separately; a processor unit 1 having a monitor function for monitoring the operating conditions of the respective test units 31–33 and a man-machine interface function; and an interface control unit 2 for controlling the communication routes between the respective test units 31–33 and the processor unit 1. The test units 31–33 and devices-under-test 41–43 are connected one to one. The test units 31–33 have the same internal structure, and comprise microprocessors 51–53 for controlling the internal operations, test circuits 61–63 for testing the corresponding devices-under-test 41–43, and interfaces 71–73 for communicating with the interface control unit 2.

When testing a plurality of devices-under-test by such a structure, first, the processor unit 1 outputs a communication request to the test unit 31 through the interface control unit 2. After the interface control unit 2 recognizes the communication request, it ensures a communication route to the test unit 31 and transmits the communication request from the processor unit 1 to the microprocessor 51 through the interface 71 in the test unit 31. The microprocessor 51 sends back a notice to the processor unit 1 through the interface 71 and the interface control unit 2 according to the situation. More specifically, if communication is feasible, the microprocessor 51 sends back a notice indicating that communication is feasible, and, if communication is infeasible, the microprocessor 51 sends back a notice indicating that communication is infeasible.

If the notice sent from the microprocessor 51 indicates that communication is feasible, the processor unit 1 transmits a request to start a test to the microprocessor 51 through the interface control unit 2 and the interface 71. After the microprocessor 51 recognizes the request to start a test, it executes the test program and operates the test circuit 61 to start testing the device-under-test 41. Similarly, the processor unit 1 performs this operation on the test units 32 and 33 one after another and starts the tests of the devices-under-test 42 and 43. Moreover, the processor unit 1 can respond to the requests from the respective test units 31–33 by polling the operating conditions of the test units 31–33 through the interface control unit 2.

When transferring data indicating completion of test from the test unit 31, first, the microprocessor 51 sends a transfer request to the interface control unit 2 through the interface 71 in the test unit 31. After the interface control unit 2 recognizes the transfer request, it outputs the transfer request to the processor unit 1 and ensures a communication route between the processor unit 1 and the microprocessor 51. When the processor unit 1 recognizes the transfer request from the microprocessor 51 by polling, it sends back a notice indicating that data transfer is feasible to the microprocessor 51 through the interface control unit 2 and the interface 71. The microprocessor 51 recognizes that data transfer is feasible, and transfers data indicting completion of the test to the processor unit 1.

Thereafter, the processor unit 1 opens the communication route between the processor unit 1 and the microprocessor 51 in the interface control unit 2 and processes the data sent from the microprocessor 51, and then monitors whether or not there is a transfer request of data indicating completion of test from other test units 32 or 33 by polling. The processor unit 1 repeats this operation, and the tests are completed when data indicating completion of test is transferred from all the test units 31–33.

Besides, in the case where test results including measurement data are transferred to the processor unit 1 from the respective test units 31–33, similarly to the transfer of data indicating completion of test, the processor unit 1 communicates with the microprocessors 51–53 one after another, the respective microprocessors 51–53 transfer the test results, and the sent data is processed in the processor unit 1.

In recent years, in order to improve the efficiency of testing a plurality of devices-under-test, a wafer batch test has started to be used. In the case where independent tests are simultaneously performed on a large number of devices-under-test by the above-mentioned structure and test method of the conventional technique as in the wafer batch test, since test units are connected one to one to the respective devices-under-test, the same number of test units and microprocessors in the test units as the number of devices-under-test to be tested simultaneously are provided, and it is necessary to output test start requests from one processor unit by sequentially communicating with a large number of microprocessors in the respective test units one by one through the interface control unit. Moreover, one processor unit needs to respond to all the transfer requests of data indicating completion of test and the transfer requests of test results from a large number of microprocessors.

In other words, since one processor unit needs to perform control of all the microprocessors (requests to start a test, etc.) and management (such as test completion requests from the respective microprocessors, transfer requests of test results, and processing of the transferred test results), the communication time between the processor unit and each microprocessor and the processing time in the processor unit increase with an increase in the number of devices-under-test to be tested simultaneously. Furthermore, the transfer time of test results obtained in the respective test units and the waiting time until the test results are transferred increase due to the influence of an increase in the communication time and the processing time. As a result, there is the problem of lowered testing efficiency which influences mass-production.

BRIEF SUMMARY OF THE INVENTION

The present invention has been made with the aim of solving the above problems, and it is an object of the present invention to provide a test apparatus and a test method capable of simultaneously performing independent tests on a large number of devices-under-test and significantly improving the testing efficiency.

A test apparatus of the present invention is a test apparatus for independently testing each of a plurality of devices-under-test, and comprises: a controller for sending test requests for the devices-under-test and receiving test results of the device-under-test; a plurality of test units for executing tests on the devices-under-test, respectively, and receiving the test results; and one or a plurality of control units, provided between the controller and the test units, for controlling a test process in the respective test units according to the test requests from the controller, and transferring the test results obtained in the test units to the controller.

According to a test apparatus of the present invention, in addition to the above-mentioned structure, the control unit comprises: selecting means for generating a selection signal for selecting one test unit among a plurality of test units connected to itself; means for obtaining test results from the plurality of test units and storing the test results on a test-unit by test-unit basis; command means for generating a command to the test units corresponding to the test requests from the controller; means for storing identification data for identifying whether or not the test process in the test units has been completed; and means for storing a test program to be loaded into each test unit.

According to a test apparatus of the present invention, in addition to the above-mentioned structure, each of the test units comprises; means for enabling itself in response to the selection signal generated by the selecting means; recognition means for recognizing the command generated by the command means; and test means for executing a test on the corresponding device-under-test based on the command.

According to a test apparatus of the present invention, in addition to the above-mentioned structure, each of the test units further comprises: first storage means for storing test results obtained in the test means; second storage means for storing the test program loaded from the control unit; and means for enabling one of the recognition means, the first storage means, and the second storage means based on an instruction from the control unit.

A test method of the present invention is a test method for testing a plurality of devices-under-test, and comprises: providing a controller for sending test requests for the devices-under-test and receiving test results of the devices-under-test; providing one test unit for each of the plurality of devices-under-test, for executing a test on each of the devices-under-test; providing a control unit for managing a plurality of the test units; and operating the plurality of the test units managed by the control unit, in parallel, to simultaneously perform independent tests on the respective devices-under-test.

According to a test method of the present invention, in the above method, a plurality of the control units are further provided, and the plurality of the control units are operated in parallel to manage the test units.

A test apparatus and a test method of the present invention provide, between a controller and a plurality of test boards, a multi test board control unit for recognizing requests from the controller and transferring test results sorted by controlling and managing the respective test boards to the controller, and the respective test boards test the corresponding devices-under-test in parallel. Accordingly, it is possible to simultaneously perform independent tests on a large number of devices-under-test such as semiconductor integrated circuits, and the testing efficiency is extremely high. Note that when a plurality of such multi test board control units are provided and operated in parallel, it is possible to simultaneously perform independent tests on a greater number of devices-under-test, and the testing efficiency is further increased.

The above and further objects and features of the invention will more fully be apparent from the following detailed description with accompanying drawings.

DETAILED DESCRIPTION OF THE INVENTION

Figure 1:
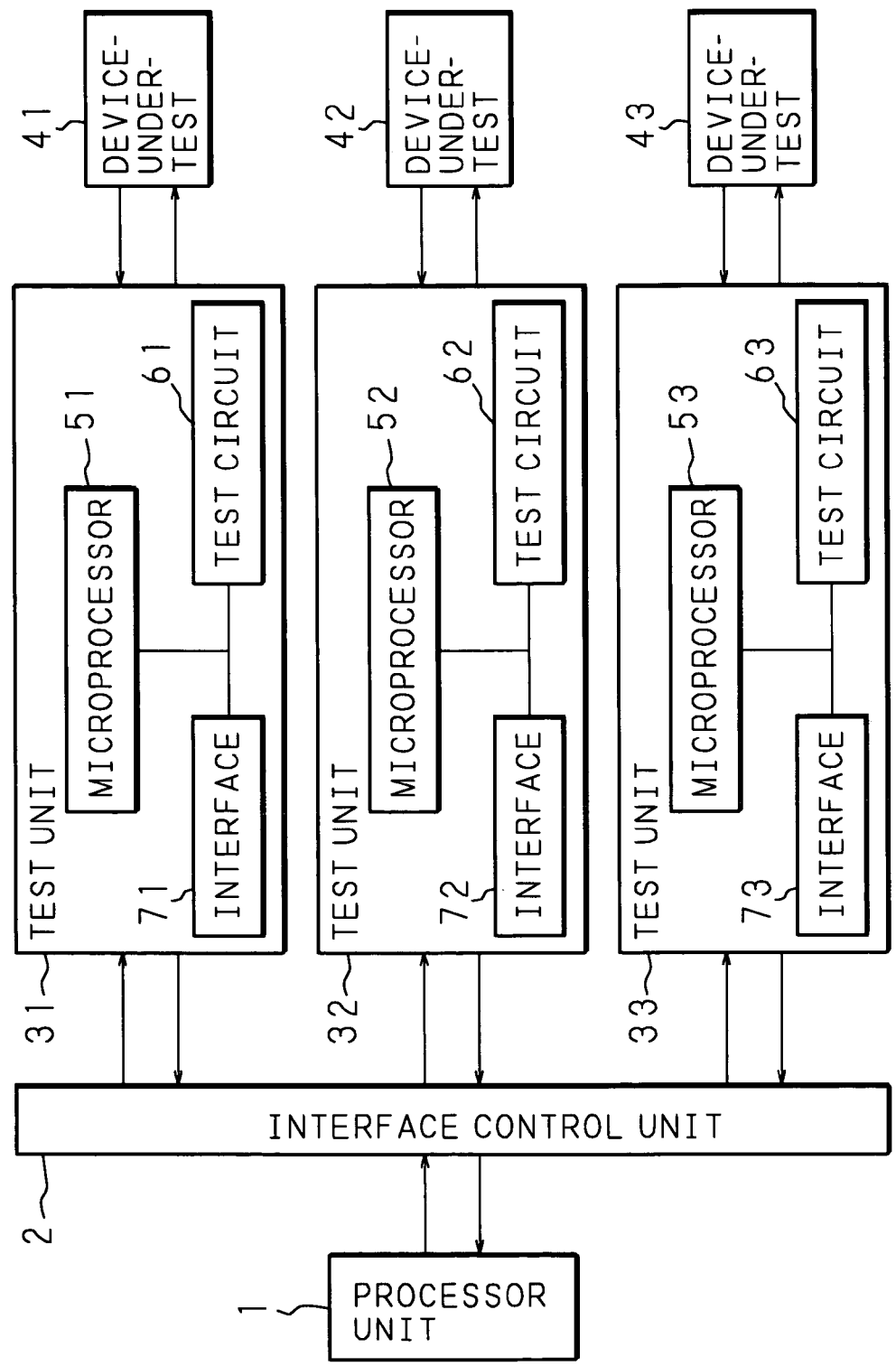
FIG. 1 is a view showing an example of the structure of a conventional test apparatus.
Figure 2:
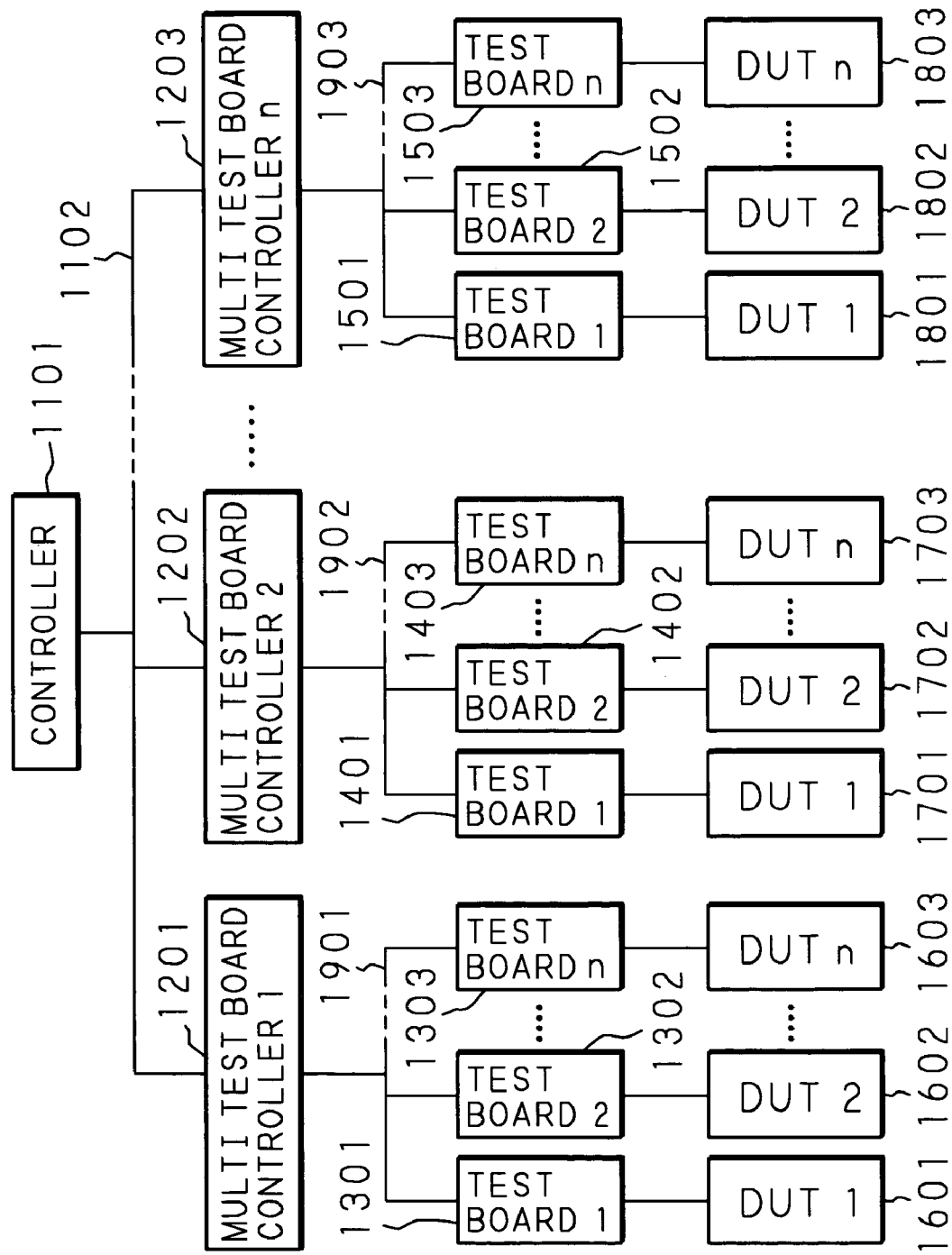
FIG. 2 is a view showing the entire structure of a test apparatus for semiconductor integrated circuits according to the present invention.
Figure 3:
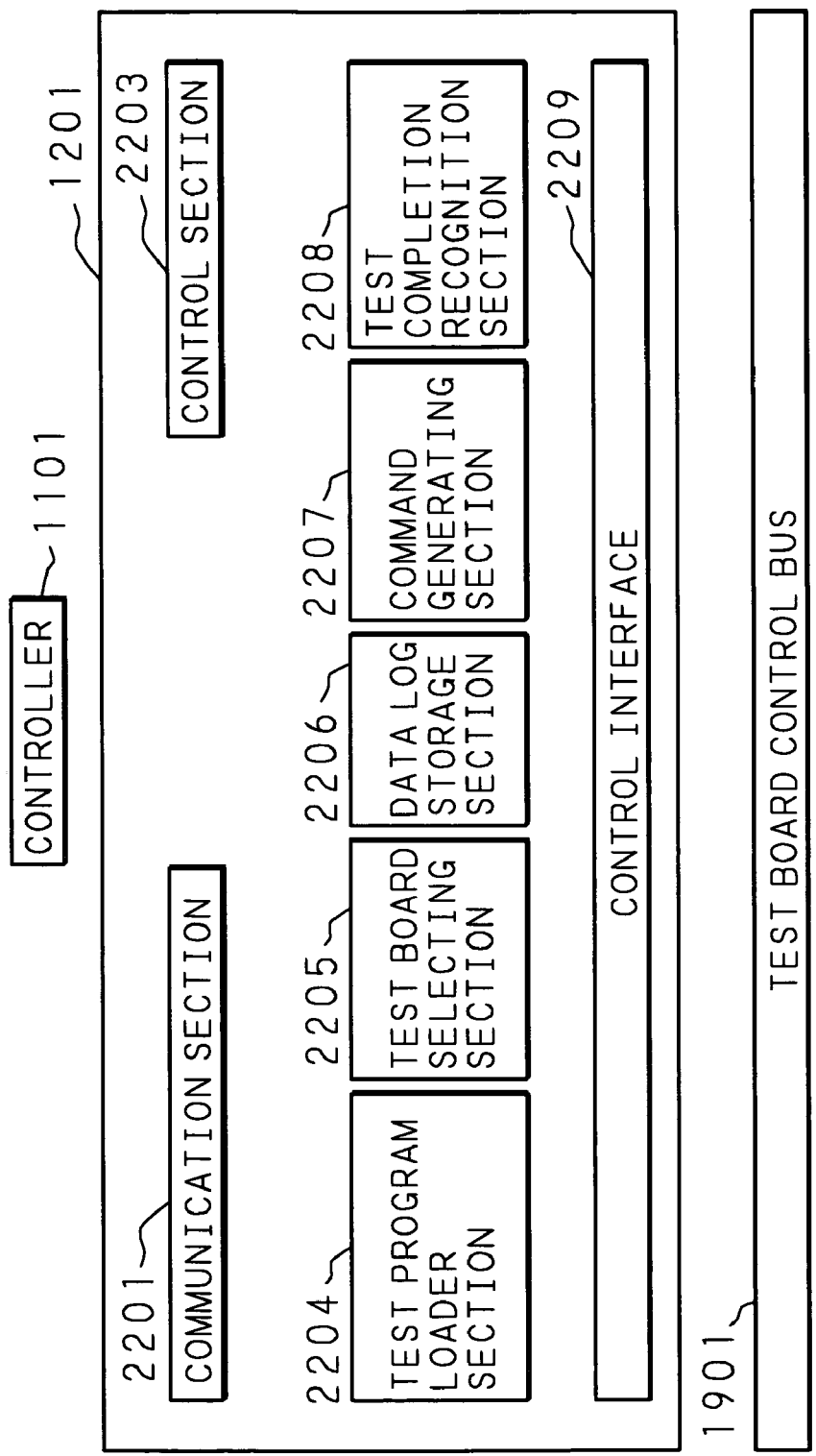
FIG. 3 is a view showing the internal structure of a multi test board controller.
Figure 4:
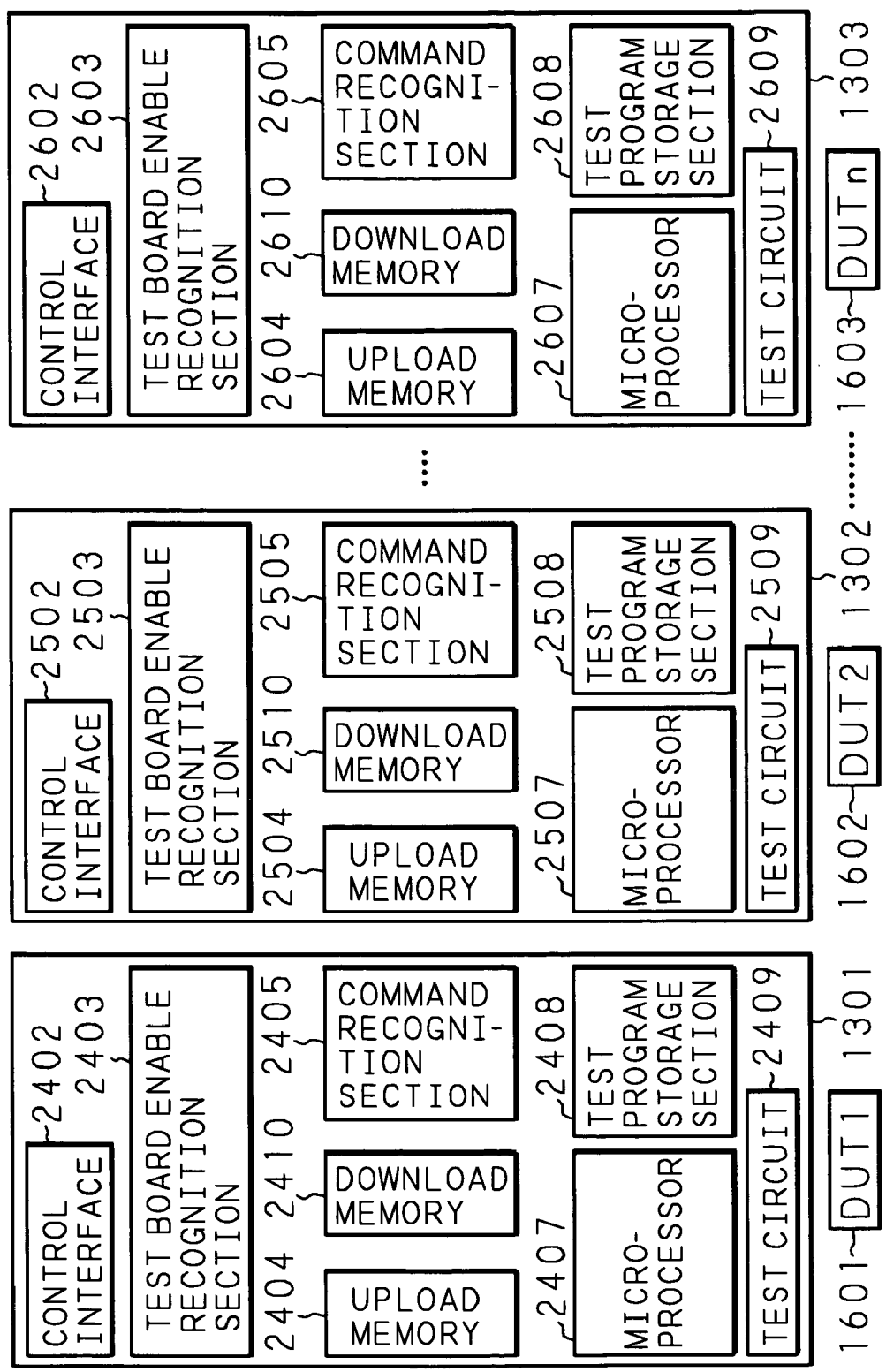
FIG. 4 is a view showing the internal structure of test boards.

The following description will specifically explain the present invention with reference to the drawings illustrating an embodiment thereof. FIGS. 2 through 5B are views for explaining a test apparatus according to the present invention, and more specifically FIG. 2 is a view showing the entire structure of the present invention, FIG. 3 is a view showing the internal structure of the multi test board controller shown in FIG. 2, FIG. 4 is a view showing the internal structure of the test boards shown in FIG. 2, and FIGS. 5A and 5B are views showing the connection state of the multi test board controller and the test board.

As shown in FIG. 2, a test apparatus of the present invention for devices-under-test; such as semiconductor integrated circuits, comprises: one controller 1101; a plurality of multi test board controllers 1201–1203 as control units; and a plurality of test boards 1301–1303, 1401–1403, 1501–1503 connected as test units to the respective multi test board controllers 1201–1203. The controller 1101 is a processor having a function of controlling and managing the respective multi test board controllers 1201–1203, and a man-machine interface function.

The controller 1101 and the respective multi test board controllers 1201–1203 are connected with the Ethernet 1102, while the respective multi test board controllers 1201–1203 and the respective test boards 1301–1303, 1401–1403, 1501–1503 are connected with test board control buses 1901–1903, so that the multi test board controllers 1201, 1202 and 1203 are operated in parallel in response to requests from the controller 1101, and control and manage the respective test boards 1301–1303, 1401–1403, 1501–1503 in parallel. One device-under-test (hereinafter referred to as DUT (Device-Under-Test)) 1601–1603, 1701–1703, 1801–1803, such as a semiconductor integrated circuit, which is an object to be tested, is provided for each test board 1301–1303, 1401–1403, 1501–1503.

Figure 5A:
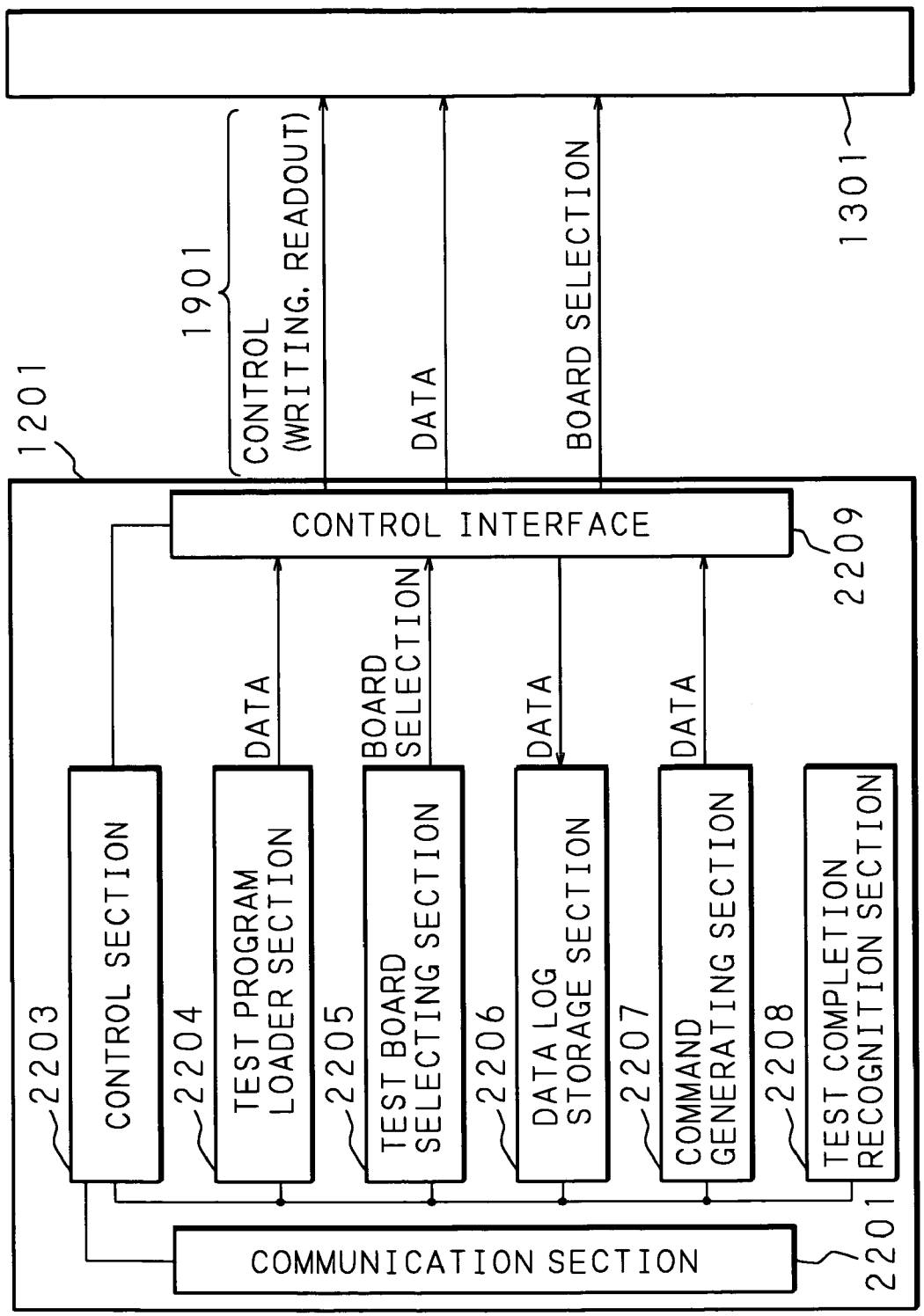
FIGS. 5A and 5B are views showing the connection state of the multi test board controller and the test board.
Figure 5B:
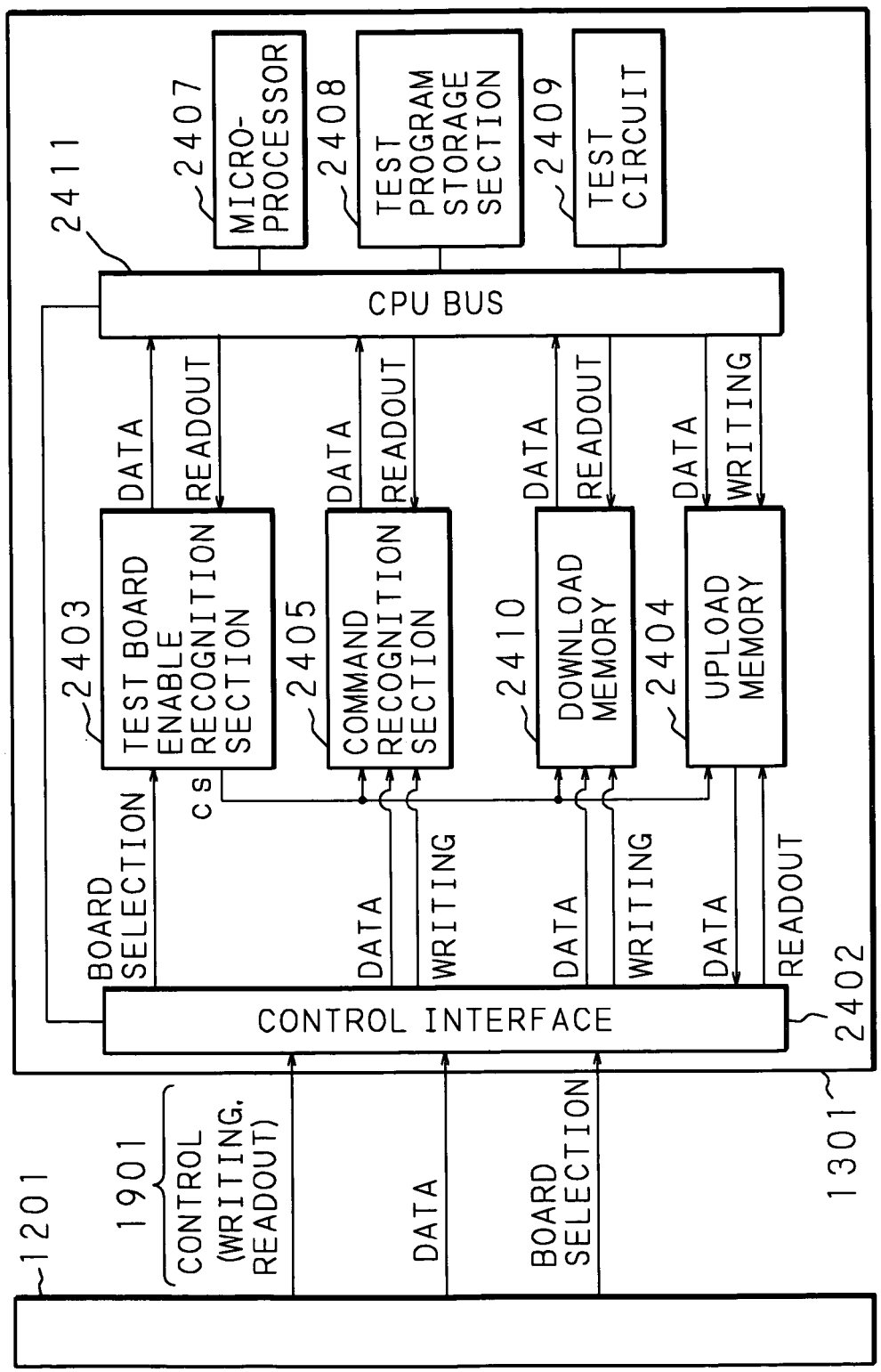

As shown in FIGS. 3 and 5A, the multi test board controller 1201 comprises a communication section 2201, a control section 2203, a test program loader section 2204, a test board selecting section 2205, a data log storage section 2206, a command generating section 2207, a test completion recognition section 2208, and a control interface 2209.

The communication section 2201 controls the communication with the controller 1101 over the Ethernet 1102. The control section 2203 controls the entire multi test board controller 1201. The test program loader section 2204 stores the data of a test program to be loaded into each of the test boards 1301–1303. The test board selecting section 2205 generates a test board selection signal for selecting one of the test boards 1301–1303, and a selection signal within the test board for selecting one of command recognition sections 2405, 2505, 2605, upload memories 2404, 2504, 2604, download memories 2410, 2510, 2610 on the test boards 1301, 1302 and 1303.

The data log storage section 2206 retrieves test results including measurement data from the upload memories 2404, 2504, 2604 in the respective test boards 1301–1303, and stores the results by sorting the results according to the test boards 1301–1303. The command generating section 2207 generates a command corresponding to a request from the controller 1101. The test completion recognition section 2208 recognizes which test board has completed the test, or whether all the test boards 1301–1303 have completed the tests. The control interface 2209 is an interface to the respective test boards 1301–1303, and controls the communication with each of the test boards 1301–1303.

With the above-described structure, the multi test board controller 1201 can recognize requests from the controller 1101, control and manage the respective test boards 1301–1303 according to the requests, and transfer data, including the test results sorted according to the test boards 1301–1303, to the controller 1101.

Note that although FIGS. 3 and 5A illustrate only the internal structure of the multi test board controller 1201, other multi test board controllers 1202 and 1203 also have the same internal structure as the multi test board-controller 1201. Since the functions of the component members are the same, illustration and explanation of the internal structure of the multi test board controllers 1202 and 1203 are omitted.

Further, as shown in FIGS. 4 and 5B, the respective test boards 1301–1303 have control interfaces 2402, 2502, 2602, test board enable recognition sections 2403, 2503, 2603, upload memories 2404, 2504, 2604, command recognition sections 2405, 2505, 2605, microprocessors 2407, 2507, 2607, test program storage sections 2408, 2508, 2608, test circuits 2409, 2509, 2609, download memories 2410, 2510, 2610, and CPU bus 2411.

Each of the control interfaces 2402, 2502, 2602 is an interface to the multi test board controller 1201 through the test board control bus 1901. The test board enable recognition sections 2403, 2503, 2603 enable a corresponding test board or all the test boards 1301–1303 based on the test board selection signal generated by the test board selecting section 2205 of the multi test board controller 1201, and enables one of the command recognition section 2405, 2505, 2605, upload memory 2404, 2504, 2604, and download memory 2410, 2510, 2610 based on the selection signal within the test board.

The test circuits 2409, 2509 and 2609 execute tests on the corresponding DUTs 1601, 1602, 1603. The microprocessors 2407, 2507 and 2607 control the test circuits 2409, 2509, and 2609, respectively.

Each of the download memories 2410, 2510, 2610 temporarily stores the data of the test program sent from the test program loader section 2204 of the multi test board controller 1201. The upload memories 2404, 2504 and 2604 temporarily store test results obtained in the test boards 1301, 1302 and 1303, respectively. The test program storage sections 2408, 2508 and 2608 store the data of the test programs. After the test program data is stored once in the download memories 2410, 2510, 2610, it is transferred to and stored in the test program storage sections 2408, 2508, 2608. Then, under the control of the microprocessors 2407, 2507 and 2607, tests are executed according to the test programs in the test program storage sections 2408, 2508 and 2608.

With such a structure, it is possible to control and mange the respective test boards 1301–1303 from the multi test board controller 1201 and retrieve the test results obtained in the respective test boards 1301–1303.

Note that although FIGS. 4 and 5B illustrate only the internal structure of the test boards 1301–1303 connected to the multi test board controller 1201, the test boards 1401–1403, 1501–1503 connected to other multi test board controllers 1202, 1203 also have the same internal structure as the test boards 1301–1303. Since the functions of the component members are also the same, illustration and explanation of the internal structure of the test boards 1401–1403, 1501–1503 are omitted.

In response to the requests from the controller 1101, the respective multi test board controllers 1201, 1202 and 1203 operate in parallel, and control and mange the respective test boards 1301–1303, 1401–1403, 1501–1503 in parallel. Since the controller 1101 only needs to control and manage an appropriate number of multi test board controllers 1201, 1202, 1203, the communication time becomes shorter. Moreover, since the multi test board controllers 1201, 1202, 1203 sort the test results from the respective test boards 1301–1303, 1401–1403, 1501–1503 and transfer the sorted test results to the controller 1101, the processing time in the controller 1101 becomes shorter. Consequently, since the time taken for communication is shorter and the processing time in the controller 1101 is shorter, even when independent tests are simultaneously performed on a large number of DUTs (Devices-Under-Test such as semiconductor integrated circuits) as in a wafer batch test, the testing efficiency will not be lowered.

Next, the actual operations of a test procedure according to the present invention will be explained. First, the following explains the operations from the operation of sending test start requests from the controller 1101 to the respective test boards 1301–1303, 1401–1403, 1501–1503 to the operation of simultaneously starting tests by the respective test boards 1301–1303, 1401–1403, 1501–1503.

First, the controller 1101 communicates with the respective multi test controllers 1201–1203 one after another, and transfers the data of the test programs in the controller 1101 to the respective multi test controllers 1201–1203 one after another. Each of the multi test controllers 1201–1203 stores the data of the test program sent from the controller 1101 into the test program loader section 2204, and notifies the controller 1101 that the storing has been completed.

Next, the controller 1101 controls the control section 2203 of each of the multi test controllers 1201–1203 to send a test board selection signal and a selection signal within the test board from the test board selecting section 2205 to the test boards 1301–1303, 1401–1403, 1501–1503 and select the corresponding test boards 1301–1303, 1401–1403, 1501–1503 and download memories 2410–2610. When the test programs of the respective test boards 1301–1303, 1401–1403, 1501–1503 are the same, all the test boards 1301–1303, 1401–1403, 1501–1503 are selected and simultaneously written into the download memories 2410–2610 of all the test boards 1301–1303, 1401–1403, 1501–1503 from the multi test board controllers 1201–1203. When the test programs of the respective test boards 1301–1303, 1401–1403, 1501–1503 are different, corresponding test programs are written one after another into the download memories 2410–2610 of the respective test boards 1301–1303, 1401–1403, 1501–1503. These operations are performed when the data of the test program is changed, and are not performed if there is no change in the data.

Next, the controller 1101 communicates with the respective multi test controllers 1201–1203 one after another, and sends test start requests to the respective multi test controllers 1201–1203 one after another.

Note that although the following explanation is provided by taking the multi test controller 1201 as an example, the respective multi test controllers 1201–1203 operate in parallel after recognizing the test start requests from the controller 1101, and the respective test boards 1301–1303, 1401–1403, 1501–1503 also operate in parallel.

After recognizing the test start request from the controller 1101, the multi test controller 1201 generates a signal for selecting all the test boards 1301–1303 and a signal for selecting the command recognition sections 2405, 2505, 2605 from the test board selecting section 2205, and generates a command signal for the test start from the command generating section 2207. These signals are inputted to the test board enable recognition sections 2403, 2503, 2603 of the respective test boards 1301–1303 through the control interface 2209 and the test board control bus 1901, and the test board enable recognition sections 2403, 2503, 2603 validate the command recognition sections 2405, 2505, 2605.

Meanwhile, since the microprocessors 2404, 2507 and 2607 monitor the command recognition sections 2405, 2505 and 2605, respectively, they recognize this validation as a test start request, control the respective test circuits 2409, 2509, 2609 based on the test programs stored in the respective test program storage sections 2408, 2508, 2608, and simultaneously and independently start the tests on the respective DUTs 1601–1603.

Next, the following description will explain the operation of storing the results of tests performed in the respective test boards 1301–1303, 1401–1403, 1501–1503 into the controller 1101, and operations performed until the controller 1101 recognizes completion of the tests of all the test boards 1301–1303, 1401–1403, 1501–1503. Note that although the following explanation is provided by taking the multi test controller 1201 and the test boards 1301–1303 connected to the multi test controller 1201 as an example, the respective multi test controllers 1201–1203 operate in parallel, and the respective test boards 1301–1303, 1401–1403, 1501–1503 also operate in parallel.

The respective test boards 1301–1303 store the obtained test results into the respective upload memories 2404, 2504, 2604 one after another, and store completion identification data for identifying completion of test when the test has been completed into the respective upload memories 2404, 2504, 2604.

On the other hand, the multi test board controller 1201 generates a test board selection signal for selecting one test board 1301 and a selection signal within the test board for selecting the upload memory 2404 from the test board selecting section 2205. These signals are inputted into the test board 1301 through the control interface 2209 and the test board control bus 1901. Consequently, the test board 1301 is enabled, and the upload memory 2404 is selected and accessible.

The multi test board controller 1201 retrieves the test results stored in the upload memory 2404 at this time, confirms whether or not there is completion identification data for identifying completion of test in the retrieved data, and stores the retrieved test results in a predetermined region of the data log storage section 2206. The storage region of the data log storage section 2206 is divided into parts corresponding to the respective test boards 1301–1303, and the test results from the test board 1301 are stored in the region assigned to the test board 1301. Moreover, if there is completion identification data for identifying completion of test in the retrieved data, a result indicating that the test of the test board 1301 has been completed is stored in the test completion recognition section 2208.

Thus, the multi-test board controller 1201 selects the respective test boards 1301–1303 one after another, retrieves the test results stored in the respective upload memories 2404, 2504, 2604, confirms whether or not there is completion identification data for identifying completion of test in the retrieved data, stores the retrieved test results in a predetermined region of the data log storage section 2206, and, if there is completion identification data indicating completion of test in the retrieved data, repeats the operation of storing the result indicating completion of test in the test completion recognition section 2208.

When a certain amount of data or more is stored in the data log storage section 2206, the data stored in the data log storage section 2206 is transferred to the controller 1101 by communicating with the controller 1101.

When completion of the tests of all the test boards 1301–1303 is recognized in the test completion recognition section 2208, a notice indicating completion of tests of all the test boards 1301–1303 is given by communicating with the controller 1101.

Thus, when the controller 1101 has received the notice indicating completion of test from all the multi test board controllers 1201–1203, it recognizes completion of the tests of all the test boards 1301–1303, 1401–1403, 1501–1503 and finishes the process.

Note that, when transferring the test results from the upload memory of each test board to the data log storage section of the multi test board controller, it may be possible to transfer the data from the start to end of the tests collectively from each test board, or it may be possible to divide the test results into a certain amount of data and transfer the divided pieces of data one after another. Since the transferred test results are sorted and written into a region assigned beforehand in the data log storage section, the present invention can readily meet both the case where the data is collectively transferred and the case where the data is divided and transferred.

Moreover, when the transfer of all or divided test results from one test board was finished and the process moves to transfer of data from other test board to a multi test board controller, the test board which finished the transfer can operate the test circuit according to the next test program and execute a test on the DUT. Besides, a test board which does not perform a transfer can also execute a test.

As described above, according to a test apparatus and a test method for semiconductors integrated circuits of the present invention, a multi test board controller capable of recognizing requests from a controller, controlling and managing respective test boards, and transferring sorted test results to the controller is provided between the controller and a plurality of test boards, and means for performing control and management from the multi test board controller is provided on each test board. Therefore, an extremely large number of devices-under-test can be simultaneously and independently tested like a wafer batch test, and the production efficiency and productivity can be improved.

In addition, since a test board enable recognition section and an upload memory are provided on each test board, the multi test board controller can retrieve the test results obtained in the respective test boards without communicating with the respective microprocessors. Consequently, the burden of the multi test board controller is reduced, and it is possible to increase the number of test boards that can be connected to the multi test board controller.

Furthermore, in the case where independent tests are simultaneously performed on a large number of devices-under-test like a wafer batch test, since the same number of test boards as the devices-under-test are necessary, the test boards need to be small and inexpensive. On the other hand, in the present invention, since the microprocessor does hot need to communicate with the multi test board controller, it does not require high performance, and consequently the number of devices around the processor is reduced and the effect of reducing the size of the test board is provided. As a result, there is also the effect of providing an inexpensive test apparatus.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A test apparatus for independently testing each of a plurality of devices-under-test, comprising:
   a controller for sending test requests for the devices-under-test and receiving test results of the devices-under-test;
   a plurality of test units for executing tests on the devices-under-test, respectively, and receiving the test results, each of the test units comprising a processor, a test circuit and an interface;
   a plurality of control units, provided between said controller and said test units, for controlling a test process in the respective test units according to the test requests from said controller, and transferring the test results obtained in said test units to said controller; and
   wherein said plurality of the control units are operated in parallel to manage the test units.

2. The test apparatus according to claim 1, wherein each said plurality of control units comprises a test completion recognition section for recognizing when one or a plurality of text units has completed a test.

3. A test apparatus for independently testing each of a plurality of devices-under-test, comprising:
   a controller for sending test requests for the devices-under-test and receiving test results of the devices-under-test;
   a plurality of test units for executing tests on the devices-under-test, respectively, and receiving the test results;
   one or a plurality of control units, provided between said controller and said test units, for controlling a test process in the respective test units according to the test requests from said controller, and transferring the test results obtained in said test units to said controller; and
   wherein said control unit comprises: selecting means for generating a selection signal for selecting one test unit among a plurality of test units connected to itself; means for obtaining test results from the plurality of test units and storing the test results on a test-unit by test-unit basis; command means for generating a command to the test units corresponding to the test requests from said controller; means for storing identification data for identifying whether or not the test process in the test units has been completed; and means for storing a test program to be loaded into each test unit.

4. The test apparatus of claim 3, wherein each of said test units comprises: means for enabling itself in response to the selection signal generated by said selecting means; recognition means for recognizing the command generated by said command means; and test means for executing a test on the corresponding device-under-test based on the command.

5. The test apparatus of claim 4, wherein each of said test units further comprises: first storage means for storing test results obtained in said test means; second storage means for storing the test program loaded from said control unit; and means for enabling one of said recognition means, said first storage means, and said second storage means based on an instruction from said control unit.

6. A test method for testing a plurality of devices-under-test, comprising:
   providing a controller for sending test requests for the devices-under-test and receiving test results of the devices-under-test;
   providing one test unit for each of the plurality of devices-under-test, for executing a test on each of the devices-under-test, each of the test units comprising a processor, a test circuit and an interface;
   providing a control unit for managing a plurality of the test units;
   operating the plurality of the test units managed by said control unit, in parallel, to simultaneously perform independent tests on the respective devices-under-test; and
   wherein a plurality of control units for managing the test units are provided, and the plurality of the control units are operated in parallel to manage the test units.

7. The test method of claim 6, wherein the control unit comprises a test completion recognition section for recognizing when one or more of the test units has completed a test.

* * * * *